(12) United States Patent
Ikeda et al.

(10) Patent No.: US 6,403,965 B1
(45) Date of Patent: Jun. 11, 2002

(54) X-RAY IMAGE DETECTOR SYSTEM (75) Inventors: Mitsushi Ikeda, Yokohama; Masaki Atsuta, Yokosuka; Akira Kinno; Kouhei Suzuki, both of Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/533,934

(22) Filed: Mar. 23, 2000

(30) Foreign Application Priority Data

Mar. 26, 1999 (JP) .......................................... 11-083088

(51) Int. Cl.⁷ ................................................ G01T 1/24
(52) U.S. Cl. ............................ 250/370.09; 250/363.02; 250/367; 250/370.11; 250/385.11
(58) Field of Search ........................ 250/370.09, 363.02, 250/367, 370.11, 385.11

(56) References Cited

U.S. PATENT DOCUMENTS

| 5,198,673 A | 3/1993 | Rougeot et al. |
| 5,869,837 A | * 2/1999 | Huang .................. 250/370.09 |

* cited by examiner

*Primary Examiner*—Constantine Hannaher
*Assistant Examiner*—Andrew Israel
(74) *Attorney, Agent, or Firm*—Oblon, Spivak, McClelland, Maier & Neustadt, P.C.

(57) ABSTRACT

An X-ray image detector system includes: a plurality of scanning lines; a plurality of signal lines formed so as to intersect the scanning lines; and a plurality of pixel parts, each of which is formed at a corresponding one of the intersections between the scanning lines and the signal lines so as to form an array; each of said pixel parts having an X-ray-to-charge converting part for converting an incident X-ray to an electric charge, a pixel electrode for receiving the electric charge from the X-ray-to-charge converting part, and a switching element which is operated on the basis of a signal of a corresponding one of the scanning lines, one end of the switching element being connected to the pixel electrode, and the other end of the switching element being connected to a corresponding one of the signal lines, wherein the X-ray-to-charge converting part includes at least a first X-ray-to-charge converting film, and a second X-ray-to-charge converting film having a lower resistivity than that of the first X-ray-to-charge converting film. Thus, it is possible to provide an X-ray image detector system capable of detecting an image even if X-ray irradiation is weak.

11 Claims, 9 Drawing Sheets

X-RAY IMAGE DETECTOR SYSTEM

BACKGROUND OF THE INVENTION

1. Field of the Invention

The present invention relates generally to an X-ray image detector system. More specifically, the invention relates to an X-ray image detector system for use in an X-ray diagnosing system for medical use.

2. Description of the Related Art

In recent years, in the field of medical treatment, the database of medical data for patients makes progress in order to rapidly and precisely carry out medical treatment. Patients usually receive diagnostics of a plurality of medical treatment facilities. In such a case, if there are no data of other medical treatment facilities, there is some possibility that medical treatment can not be precisely carried out. As an example, there is a problem of medicines or drugs. It is required to take account of drugs administered in other medical treatment facilities to administer appropriate drugs to carry out medical treatment.

It is also required to make database for image data of radiography. In accordance with this database system, it is desired to digitize X-ray images. In an X-ray diagnosing system for medical use, a silver halide film is conventionally used to detect an image. In order to digitize this diagnostic data, it is required to scan the film by a scanner after developing the film, so that it takes a great deal of time. Recently, there is realized a system for directly digitizing an image using a CCD camera having a size of about one inch and an image intensifier tube. However, when an image of, such as a lung, is detected by this system, it is required to provide an optical system for condensing light to detect an image of a region of about 40 cm ×40 cm, so that there is a problem of increasing the system size. There is also a problem in that resolution decreases due to the distortion of an optical system.

In order to solve these problems, there is proposed a flat-panel X-ray detector of an indirect conversion system using a thin film transistor (which will be hereinafter referred to as a "TFT") having an active layer of an amorphous silicon as a switching element (see, e.g., U.S. Pat. No. 4,689,487).

Figure 8:
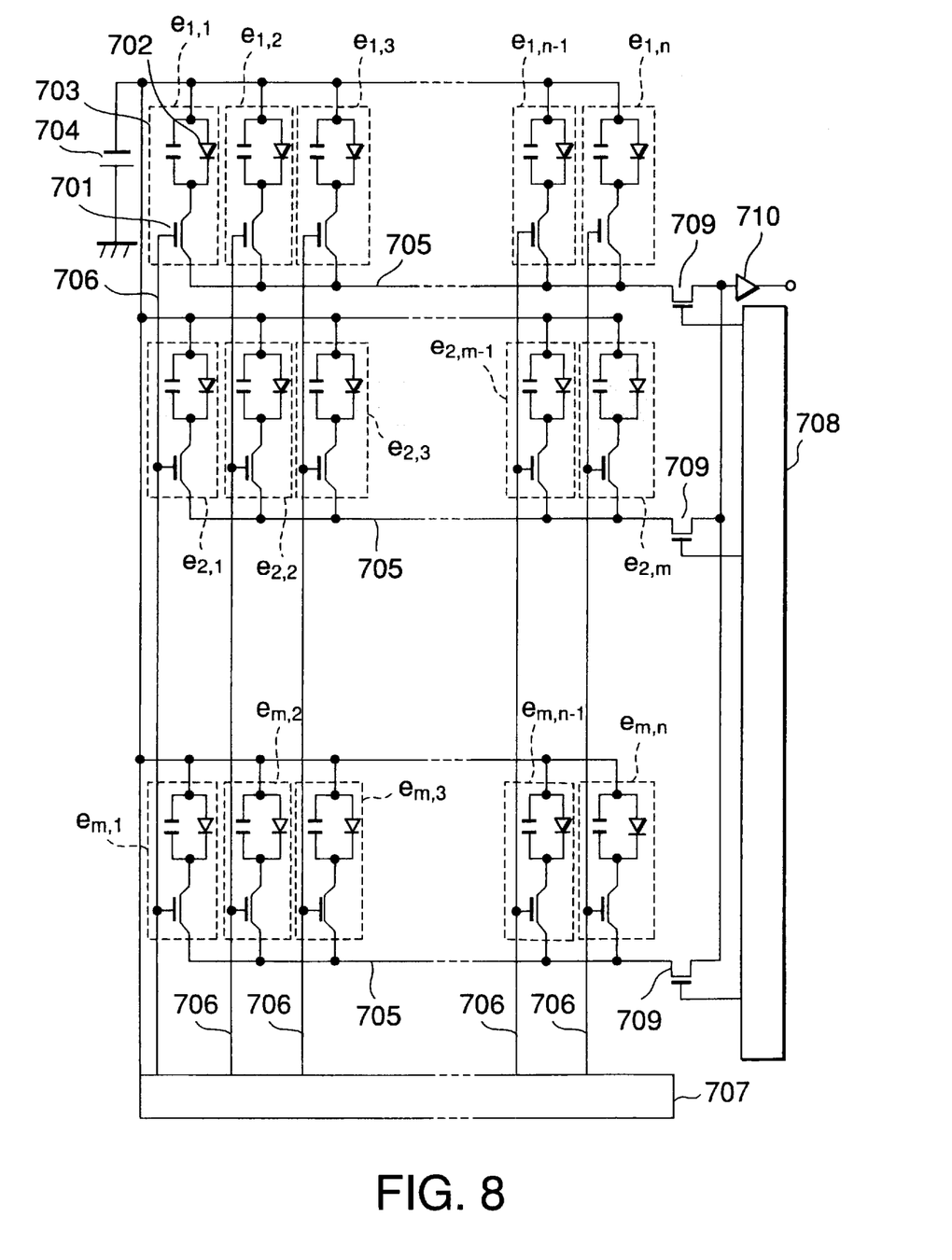
FIG. 8 is a circuit diagram of an X-ray image detector system of an indirect conversion type.

FIG. 8 shows a circuit construction of this flat-panel X-ray detector, and the operation thereof will be described below.

This flat-panel X-ray detector is a detector of an indirect conversion system for converting an incident X-ray into luminescent light by means of a phosphor or the like to change the converted light to an electric charge by means of a photoelectric transfer film of each pixel (picture element). This flat-panel X-ray detector has pixels $e_{1,1}, \ldots, e_{m,n}$ arranged in the form of an array wherein hundreds to thousands pixels are arranged on each side. Each element $e_{i,j}$ (i=1, ..., m, j=1, ..., n) has a TFT 701, a photoelectric transfer film 702 and a pixel capacity 703. The photoelectric transfer film 702 and the pixel capacity 703 are connected in parallel. To one end thereof, a negative bias voltage is applied by means of a power supply 704, and the other end is connected to one of the source and drain of the TFT 701. The other end of the source and drain of the TFT 701 is connected to a signal line 705, and the gate of the TFT 701 is connected to a scanning line 706. The on/off of the TFT 701 is controlled by a scanning line driving circuit 707. The terminal of the signal line 705 is connected to an amplifier 710 for signal detection via a switch 709 controlled by a signal line control circuit 708.

If X-rays are incident on the flat-panel X-ray detector, the phosphor irradiated with the X-rays emits light, and the emitted light is converted into an electric charge by means of the photoelectric transfer film 702, so that the electric charge accumulates in the pixel capacity 703. When one scanning line 706 is driven by the scanning line driving circuit 701 so that all of TFTs 701 connected to the scanning line 706 are turned on, the accumulating charge is transferred to the amplifier 710 via the signal line 705. Then, the electric charge for each pixel is inputted to the amplifier 710 by means of the switch 709 to be converted to dot sequential signals capable of being displayed on a CRT or the like. The quantity of electric charge varies in accordance with the quantity of light being incident on each pixel $e_{i,j}$ (i=1, ..., m, j=1, ..., n), so that the amplitude of output of the amplifier 710 varies.

The flat-panel X-ray detector of the indirect conversion system shown in FIG. 8 can directly form a digital image by the A/D conversion of the output signal of the amplifier 710. Moreover, it is possible to produce a pixel region of a thin and large-screen by the array of the TFTs 701.

There are other flat-panel X-ray detectors of a direct conversion system for directly converting X-rays being incident on pixels into an electric charge.

The flat-panel X-ray detector of this direct conversion system has no phosphor. At this point, the flat-panel X-ray detector of the direct conversion system is different from that of the above-described indirect conversion system. In addition, in the flat-panel X-ray detector of the direct conversion system, the magnitude of a bias applied to a photoelectric transfer film or an X-ray-to-charge converting film is different from that in the indirect conversion system.

In the case of the indirect conversion system, a bias of several volts to over ten volts is applied to the photoelectric transfer film. When fluorescence enters the photoelectric transfer film, the electric charge accumulates in the pixel capacity provided in parallel to the photoelectric transfer film in each pixel. In this case, the voltage applied to the pixel capacity is a bias of several volts to over ten volts applied to the photoelectric transfer film at the maximum.

On the other hand, in the direct conversion system, the X-ray-to-charge converting film, the pixel capacity and the TFT serving as a switch for each pixel are connected in series, and a high bias of several kV is applied thereto. Therefore, when X-rays are incident on the pixel, the electric charge produced by the X-ray-to-charge converting film accumulates in the pixel capacity. However, if the quantity of incident X-ray is excessive, the electric charge accumulating in the pixel capacity increases, so that it is afraid that a high voltage of more than 10 kV is applied to the insulator films of the pixel capacity and the TFT to cause electrical break-down. For that reason, the direct conversion system must take measures to prevent an excessive voltage from being applied to the pixel capacity and TFTS.

Therefore, a protecting TFT serving as a protecting non-linear element is provided in each of pixels. Thus, when excessive X-rays enter a pixel, a higher electric charge than that defined by a bias is. discharged to the outside of the pixel via the protecting TFT to prevent the dielectric break-down of the TFT and pixel capacity.

Figure 9:
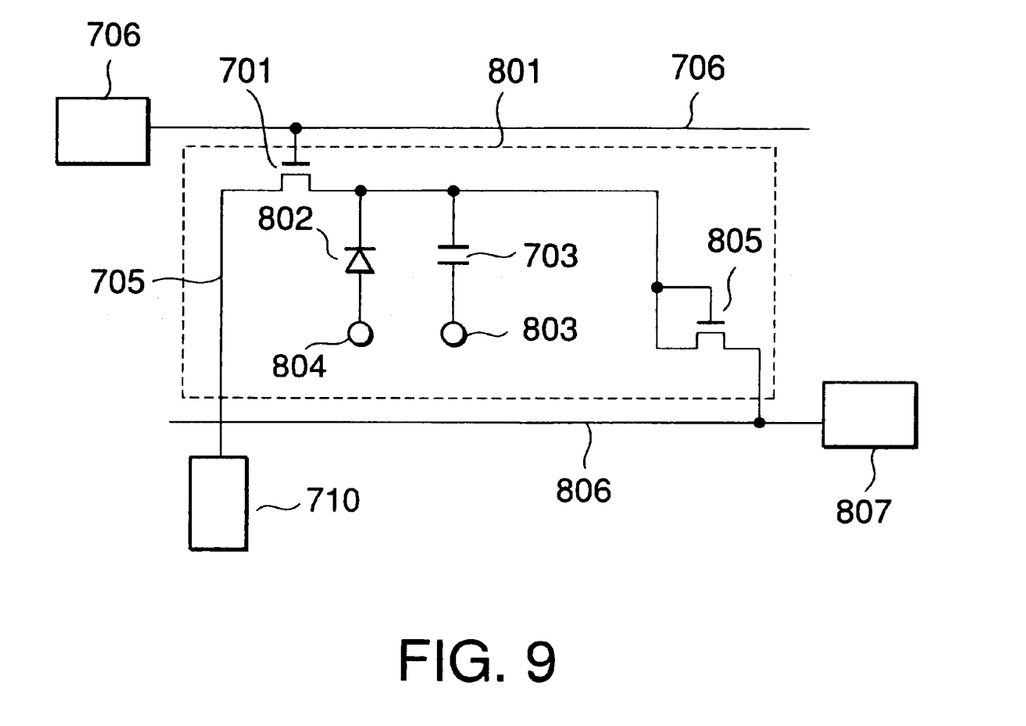
FIG. 9 is a circuit diagram of an X-ray image detector system of a direct conversion type.

FIG. 9 shows the construction of a pixel of a flat-panel X-ray detector of a direct conversion system using the protecting TFT, and the operation thereof will be described below.

Each pixel 801 of a flat-panel X-ray detector of a direct conversion system shown in FIG. 9 comprises a TFT 701 used as a switching element, an X-ray-to-charge converting film 802, and a pixel capacity 703. Similar to the X-ray detector shown in FIG. 8, the pixels 801 are arranged in the form of an array. The pixel capacity 703 is connected to a pixel capacity bias 803. To the X-ray-to-charge converting film 802, a negative bias voltage is applied by a high-voltage power supply 804. The gate of the TFT 701 is connected to a scanning line 706, and one of the source and drain of the TFT 701 is connected to a signal line 705, so that the on/off of the TFT 701 is controlled by means of a scanning line driving circuit 707. The terminal of the signal line 705 is connected to an amplifier 710 for signal detection. A protecting TFT 805 is biased by a power supply 807 via a bias line 806. The protecting TFT 805 allows an electric charge of a bias voltage or higher to escape through the bias line 806.

In both of the X-ray image detector systems using the flat-panel X-ray detectors of the direct and indirect conversion systems using the TFTs 701, very weak signals can not be detected, so that there is a lower limit to the X-ray irradiation intensity to a human body. Because a signal voltage shift is produced by a floating capacity which is received by the signal line 705 from the intersecting scanning line 706 and the bias line 806, and because there is a limit to the reduction of noises of the amplifier 710 for signal detection and noises due to leak currents or the like of the protecting TFT 805 used for the flat-panel X-ray detector of the direct conversion system. In order to solve this problem, it is considered that an amplifier circuit for amplifying the electric charge produced in the photoelectric transfer film 702 or X-ray-to-charge converting film 802 is provided for each pixel 801. However, it is difficult to realize this since the amplifier circuit is prepared by the same design rule as that of the TFTs for pixels to cause the area of only the amplifier circuit to be greater than the pixel area.

SUMMARY OF THE INVENTION

It is therefore an object of the present invention to eliminate the aforementioned problems and to provide an X-ray detector system capable of picking up an image even if X-ray irradiation is weak.

In order to accomplish the aforementioned and other objects, according to one aspect of the present invention, an X-ray image detector system comprises: a plurality of scanning lines; a plurality of signal lines formed so as to intersect the scanning lines; and a plurality of pixel parts, each of which is formed at a corresponding one of the intersections between the scanning lines and the signal lines so as to form an array; each of said pixel parts having an X-ray-to-charge converting part for converting an incident X-ray to an electric charge, a pixel electrode for receiving the electric charge from the X-ray-to-charge converting part, and a switching element which is operated on the basis of a signal of a corresponding one of the scanning lines, one end of the switching element being connected to the pixel electrode, and the other end of the switching element being connected to a corresponding one of the signal lines, wherein the X-ray-to-charge converting part includes at least a first X-ray-to-charge converting film, and a second X-ray-to-charge converting film having a lower resistivity than that of the first X-ray-to-charge converting film.

Furthermore, an electric field for causing a current multiplication is preferably applied to the first X-ray-to-charge converting film.

In addition, each of the first and second X-ray-to-charge converting films is preferably formed of Se, and the electric field for causing the current multiplication is preferably $9 \times 10^7$ V/m.

The X-ray-to-charge converting part may have a third X-ray-to-charge converting film of a first conductive type formed between the pixel electrode and the first X-ray-to-charge converting film, and a fourth X-ray-to-charge converting film of a second conductive type formed on the second X-ray-to-charge converting film, the second X-ray-to-charge converting film being formed on the first X-ray-to-charge converting film.

The X-ray-to-charge converting part may have a fifth X-ray-to-charge converting film having a lower resistivity than that of the first X-ray-to-charge converting film between the third X-ray-to-charge converting film and the first X-ray-to-charge converting film. For example, if the X-ray-to-charge converting film is formed of Se, each of the first, second and fifth X-ray-to-charge converting films often have a high resistivity, and is often formed of an i-type (intrinsic) semiconductor containing no intentionally doped impurities decreasing resistivity, or an i-type semiconductor containing a small amount of impurity. On the other hand, the third and fourth X-ray-to-charge converting films are often formed of an n-type semiconductor containing a large amount of donor impurity, or a p-type semiconductor containing a large amount of acceptor impurity. The third and fourth X-ray-to-charge converting films can decrease the resistivity to the upper or lower metal electrode to form an ohmic contact and can decrease the dark current during no X-ray irradiation serving as a noise source. Therefore, the third and fourth X-ray-to-charge converting films have the function of preventing majority carrier from being introduced from the electrode. The third and fourth X-ray-to-charge converting films may be formed of any materials of these effects.

Furthermore, at least one boundary surface of the first X-ray-to-charge converting film is preferably flattened.

In addition, the first X-ray-to-charge converting film preferably have a non-flat portion on the boundary surface, the non-flat portion being filled with a conductive material.

Moreover, the thickness of the fifth X-ray-to-charge converting film is preferably smaller than the thickness of the second X-ray-to-charge converting film.

According to another aspect of the present invention, an X-ray image detector system comprises: a plurality of scanning lines; a plurality of signal lines formed so as to intersect the scanning lines; a plurality of pixel parts, each of which is formed at a corresponding one of the intersections between the scanning lines and the signal lines so as to form an array; each of said pixel parts having an X-ray-to-luminescent light converting part for converting an incident X-ray to luminescent light, a photoelectric transfer part, formed on the plurality of pixel parts, for converting the luminescent light, which is converted by the X-ray-to-luminescent light converting part, to an electric charge, a pixel electrode for receiving the electric charge from the photoelectric transfer part, and a switching element which is operated on the basis of a signal of a corresponding one of the scanning lines, one end of the switching element being connected to the pixel electrode, and the other end of the switching element being connected to a corresponding one of the signal lines, wherein the photoelectric transfer part includes at least a first photoelectric transfer film, and a second photoelectric transfer film having a lower resistivity than that of the first photoelectric transfer film.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiments of an X-ray image detector system according to the present invention will be described in detail below. The present invention should not be limited to these preferred embodiments.

Figure 1:
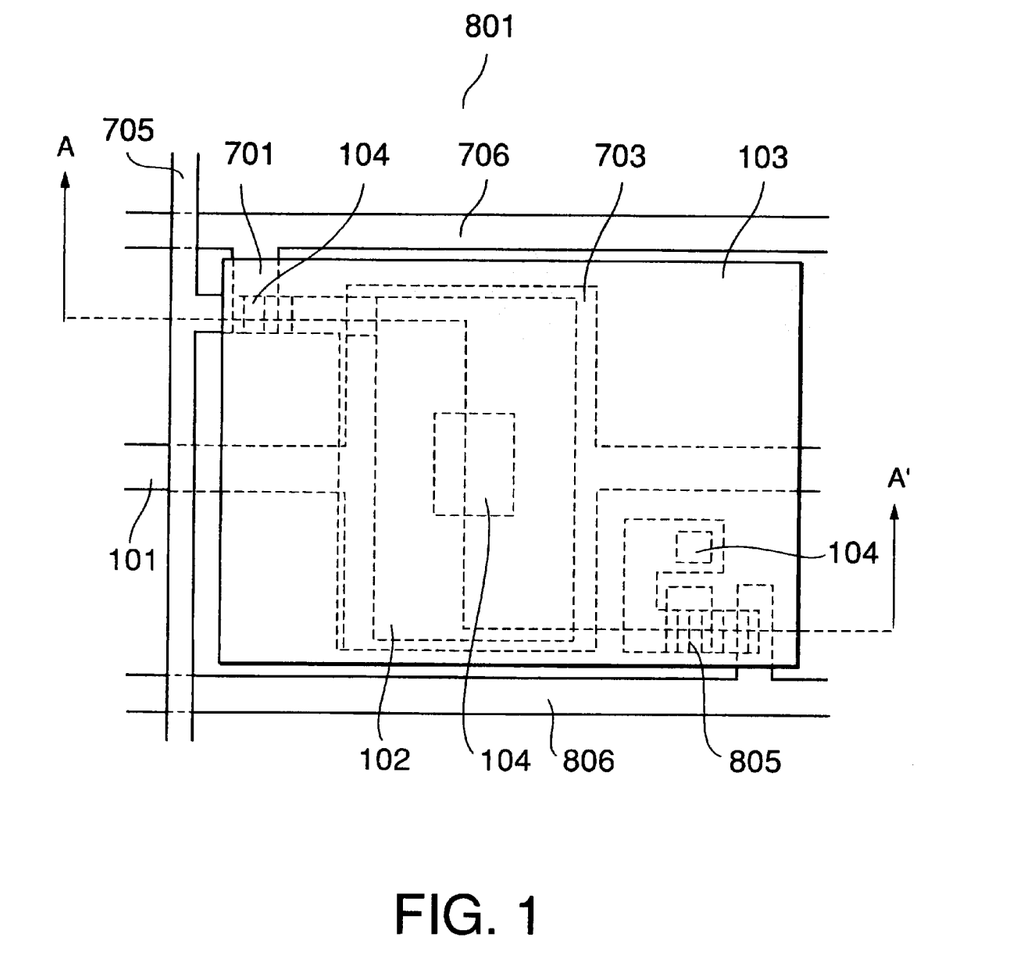
FIG. 1 is a plan view of the first preferred embodiment of an X-ray image detector system according to the present invention.
Figure 2:
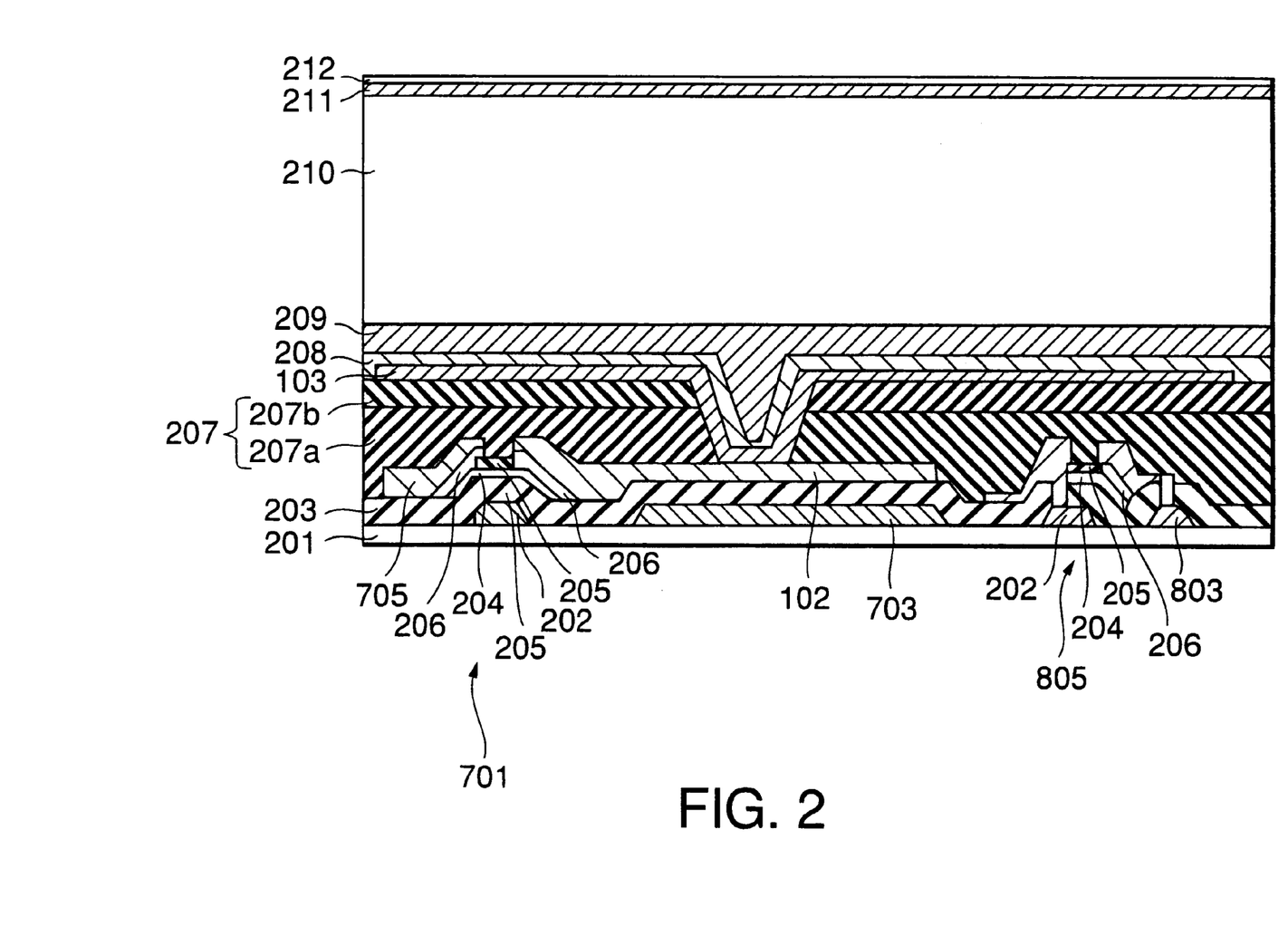
FIG. 2 is a sectional view of the first preferred embodiment of an X-ray image detector system according to the present invention, which is taken along line A–A' of FIG. 1.

Referring to FIGS. 1 and 2, the first preferred embodiment of an X-ray image detector system according to the present invention will be described below.

The first preferred embodiment is an X-ray image detector system of a direct conversion system. FIG. 1 is a plan view of the X-ray image detector system, and FIG. 2 is a sectional view taken along line A–A' of FIG. 1. In the first preferred embodiment, the X-ray image detector system comprises a plurality of signal lines 705, a plurality of scanning lines 706 formed so as to intersect the signal lines 705, a plurality of pixels 801, each of which is provided at a corresponding one of the intersections between the signal lines 705 and the scanning lines 706 and which are arranged in the form of an array, a bias line 806, an auxiliary capacity line 101, and an X-ray-to-charge converting part. Furthermore, each of the signal lines and each of the scanning lines are electrically insulated.

Each of the pixels 801 comprises a switching element 701 using a thin film transistor (which will be also hereinafter referred to as a "TFT") having an active layer of, e.g., an amorphous silicon, a protecting TFT 805, a pixel capacity 703, an auxiliary electrode 102 formed so as to face the pixel capacity 703, and a pixel electrode 103. However, in FIG. 1, only one pixel portion is shown, and upper layers than the pixel electrode 103 (e.g., the X-ray-to-charge converting part) are omitted.

The switching element 701, the protecting TFT 805, the pixel capacity 703, the signal line 705, the scanning line 706, the bias line 806 and the X-ray-to-charge converting part (X-ray-to-charge converting film 802) are connected as shown in FIG. 9. That is, the gate of the switching element 701 is connected to a corresponding one of the scanning lines 706. In addition, one terminal of the source and drain of the switching element 701 is connected to a corresponding one of the signal lines 705, and the other terminal is connected to one end of the X-ray-to-charge converting part and one end of the pixel capacity 703. The other terminal of the switching element 701 is also connected to the gate of the protecting TFT 805 and one terminal of the source and drain thereof. The other terminal of the protecting TFT 805 is connected to the bias line 806.

Each of the TFT 701, the protecting TFT 805 and the auxiliary electrode 102 is provided with a contact portion 104. Furthermore, it is not always required to provide the pixel capacity 703.

Referring to the sectional view of FIG. 2, the detailed construction will be described below.

A metal layer of a metallic material, such as MoTa, Ta, TaN, Al, Al alloy, Cu or MoW, or a laminated metal layer of two layers of metallic materials of Ta and $TaN_x$, is deposited on a glass substrate 201 so as to have a thickness of about 300 nm, and etched to form a pattern of the gate electrodes 202 of the switching element 701 and the protecting TFT 805, the scanning line 706, the pixel capacity 703, the pixel capacity line 101 and the bias line 806. Then, using the plasma chemical vapor deposition (plasma CVD), after an insulator film 203 is deposited by laminating, e.g., an $SiO_x$ film having a thickness of about 300 nm and an $SiN_x$ film having a thickness of about 50 nm, an amorphous silicon film 204 containing no impurities and having a thickness of about 100 nm, and an $SiN_x$ film having a thickness of about 200 nm serving as a stopper 205 are deposited. The stopper 205 is aligned with the gate to be patterned using the reverse exposure.

Then, after an $n^+$-type amorphous silicon film 206 having a thickness of about 50 nm is deposited, the amorphous silicon film 204 and the $n^+$-type amorphous silicon film 206 are aligned with the TFT to be etched to form islands of an amorphous silicon (active layer). The insulator films 203 of the contact portion 104 of the protecting TFT 805 and the contact portion outside of the pixel region are etched to form contact holes, respectively. Subsequently, an Mo film having a thickness of about 50 nm, an Al film having a thickness of about 350 nm, and an Mo film having a thickness of about 50 nm or about 20 nm are sputtered and deposited on the whole surface to be patterned to form the auxiliary electrode 102, the signal line 705 and other wiring.

Then, a film 207a of $SiN_x$ having a thickness of about 200 nm is deposited, and a film 207b of benzocyclobutene (BCB) having a thickness of about 1 $\mu$m to about 5 $\mu$m, preferably about 3 $\mu$m, is deposited on the film 207a to form a protective film 207. After contact holes are formed in the TFT 701, the protecting TFT 805 and the auxiliary electrode 102, a pixel electrode 103 is formed by an ITO (indium tin oxide) having a thickness of about 100 nm.

A p-type Se film 208 for contact is deposited on the pixel electrode 103 so as to have a thickness of about 1 to about 100 $\mu$m, preferably about 10 $\mu$m, and an Se film 209 having a resistivity of about $1\times10^{12}$ to about $1\times10^{16}$ $\Omega$m is deposited thereon so as to have a thickness of about 1 to 300 $\mu$m, preferably about 10 to 100 μm. Then, an Se film 210 having a resistivity of about one-tenth as large as that of the Se film 209 is deposited thereon so as to have a thickness of about 400 μm to about 1000 μm, preferably about 900 μm, and an n-type Se film 211 is deposited thereon so as to have a thickness of about 1 μm to about 100 μm, preferably about 10 μm. Thereafter, an Al film having about 100 nm is formed as a common electrode 212. Finally, the common electrode 212 is connected to a drive circuit (not shown).

The resistivity of the Se films 209 and 210 is controlled as follows. In the formation of the Se film having a low resistivity, Te of 0 to 30% by atom is added to Se. Alternatively, As may be added to Se. Since Se is usually p-type, the resistivity of the Se film can be increased by compensating an acceptor by adding an element serving as a donor, e.g., a halogen, such as Cl or I. However, the resistivity of the Se film can be decreased as n-type by further adding the halogen. Alternatively, the resistivity of the Se film may be decreased as p-type by adding an alkali metal, such as Na or K. Furthermore, the n-type Se film 211 is formed so as to have a low resistivity by adding a large amount of a halogen, such as Cl or I, to Se to produce a large number of free electrons. In addition, the p-type Se film 208 is formed so as to have a low resistivity by adding a large amount of an acceptor, such as Na, K or P, to Se to produce a large number of holes.

Figure 10:
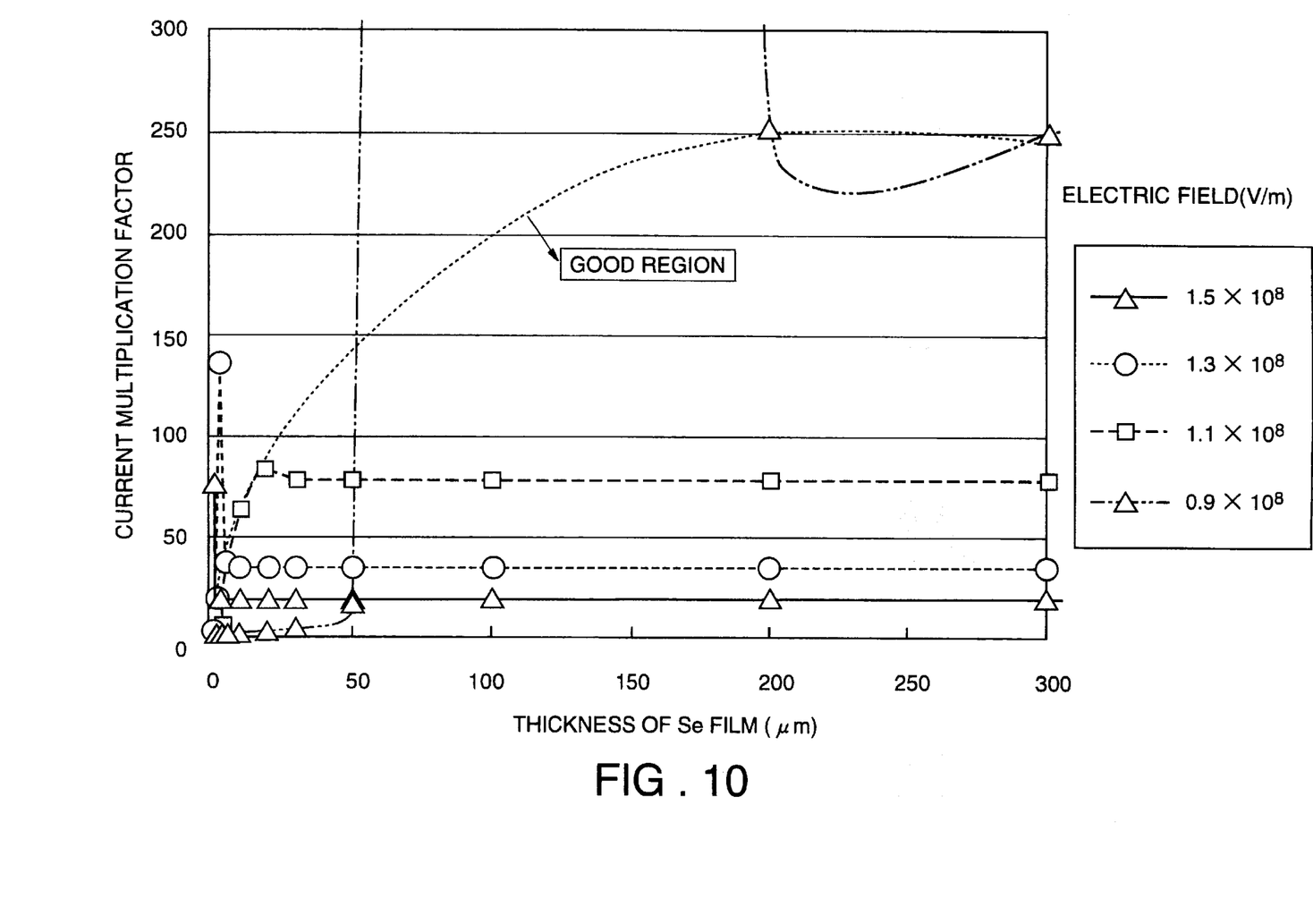
FIG. 10 is a graph showing the simulated results of the relationship between the thickness of an Se film and the absolute value of a current multiplication coefficient, using an electric field as a parameter.

Referring to FIG. 10, the preferred thickness of the Se film 209 having a high resistivity will be described. FIG. 10 is a graph showing the simulated results of the relationship between the thickness of the Se film 209 and the absolute value of the current multiplication coefficient, using the electric field as a parameter using data for the ionization rate of electrons and positive holes. In order to obtain a stable operation of the detector and a good image, the variation in current multiplication coefficient is preferably small with respect to the variation in thickness of the Se film 209 and the variation in electric field. As can be seen from FIG. 10, as the thickness of the Se film 209 increases, the Se thickness dependency of the current multiplication coefficient decreases to be stable. If the electric field is $1.5 \times 10^8$ V/m, the thickness dependency decreases when the thickness of the Se film 209 is about 1 to 2 μm or more. If the electric field is $9.0 \times 10^7$ V/m, the thickness dependency of the current multiplication coefficient is substantially zero when the thickness of the Se film 209 is 300 μm or more. As the thickness of the Se film increases, the current multiplication coefficient is saturated to be stable. However, if the thickness of the Se film is too large, it is difficult to prepare a power supply for applying a high voltage.

In order to improve the electric charge collecting efficiency, an electric field of about $1 \times 10^7$ V/m or higher is preferably applied to the low resistivity Se film. The electric field must be $8 \times 10^7$ V/m or higher, and the electric field dependency of the current multiplication coefficient decreases to be stable as the electric field increases, so that the electric field is preferably $9.0 \times 10^7$ V/m or higher. The voltage applied to the Se film is preferably 10 kV for the case of Se thickness of about 1000 μm in order to improve the electric charge collecting efficiencies of all of the Se films which needs an electric field of about $1 \times 10^7$ V/m. For that reason, taking account of the safety with respect to the variation in thickness and electric field, if the resistivity ratio of the high resistivity Se film to the low resistivity Se film is in the range of from about 10 to about 100, the thickness of the high resistivity Se film is preferably in the range of from about 10 to about 300 μm. This value may be varied in accordance with the value of the resistivity ratio of the high resistivity film to the low resistivity film. The current multiplication factor can be adjusted by the electric field and thickness.

Figure 3:
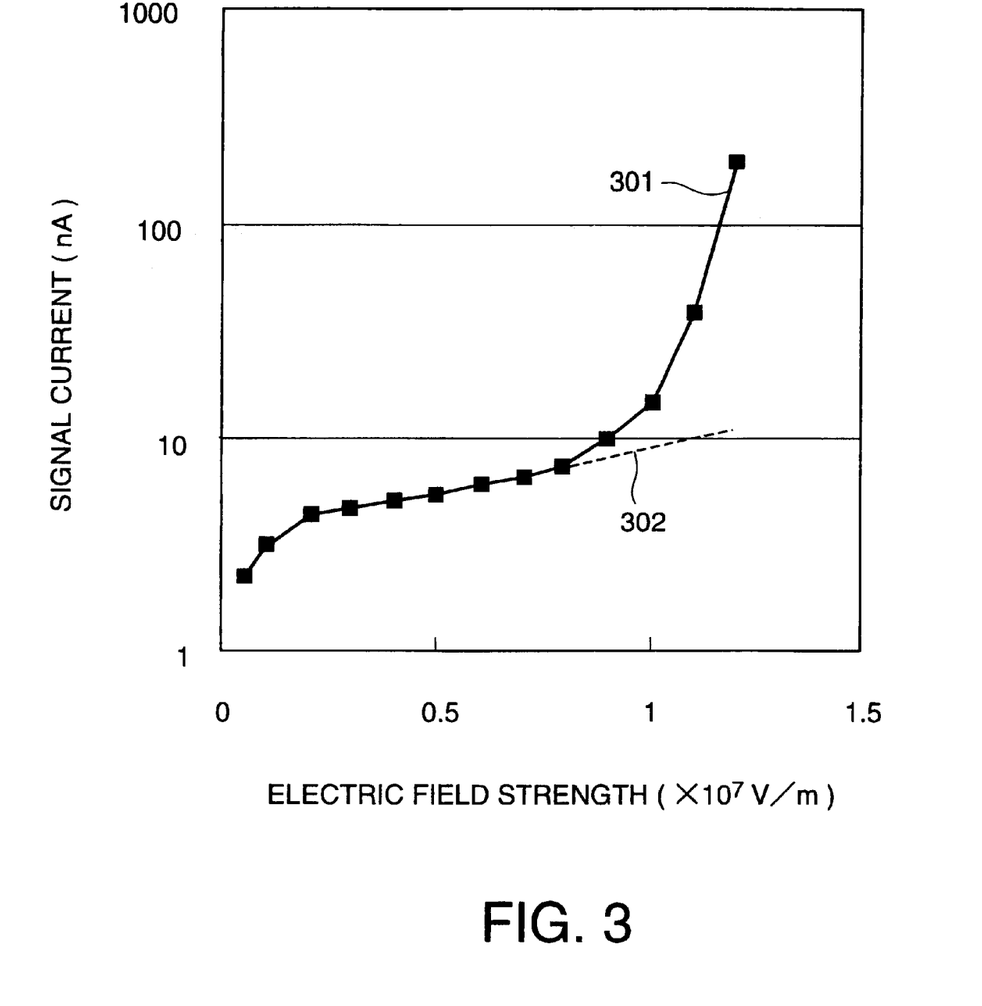
FIG. 3 is a characteristic diagram of an X-ray-to-charge converting film for use in the present invention.

FIG. 3 shows the relationship between an average electric field applied to the whole film and a signal current at that time, when the X-ray image detector system in this preferred embodiment and the conventional X-ray image detector system are used. In the X-ray image detector system in this preferred embodiment, the Se film 209 was adjusted so as to have a thickness of 100 μm and a resistivity of $1 \times 10^{14}$ Ωcm, and the Se film 210 was adjusted so as to have a thickness of 900 μm and a resistivity of $1 \times 10^{13}$ Ωm. In the conventional X-ray image detector system, the resistivity was uniform in the X-ray-to-charge converting film 802. Then, the films were irradiated with an X-ray of 500 mL, and a voltage of 1 kV to 13 kV was applied to the common electrode 212 to measure a signal current.

As a result, when the average electric field was about $1 \times 10^7$ V/m, there was a difference between the signal current 301 and the signal current 302 when the X-ray image detector system in this preferred embodiment and the conventional X-ray image detector system were used, respectively. When an average electric field of about $1 \times 10^7$ V/m was applied in the X-ray image detector system this preferred embodiment, an electric field of about $1 \times 10^8$ V/m is applied to the Se film 209, and an electric field of about $1 \times 10^7$ V/m is applied to the Se film 210.

Figure 4:
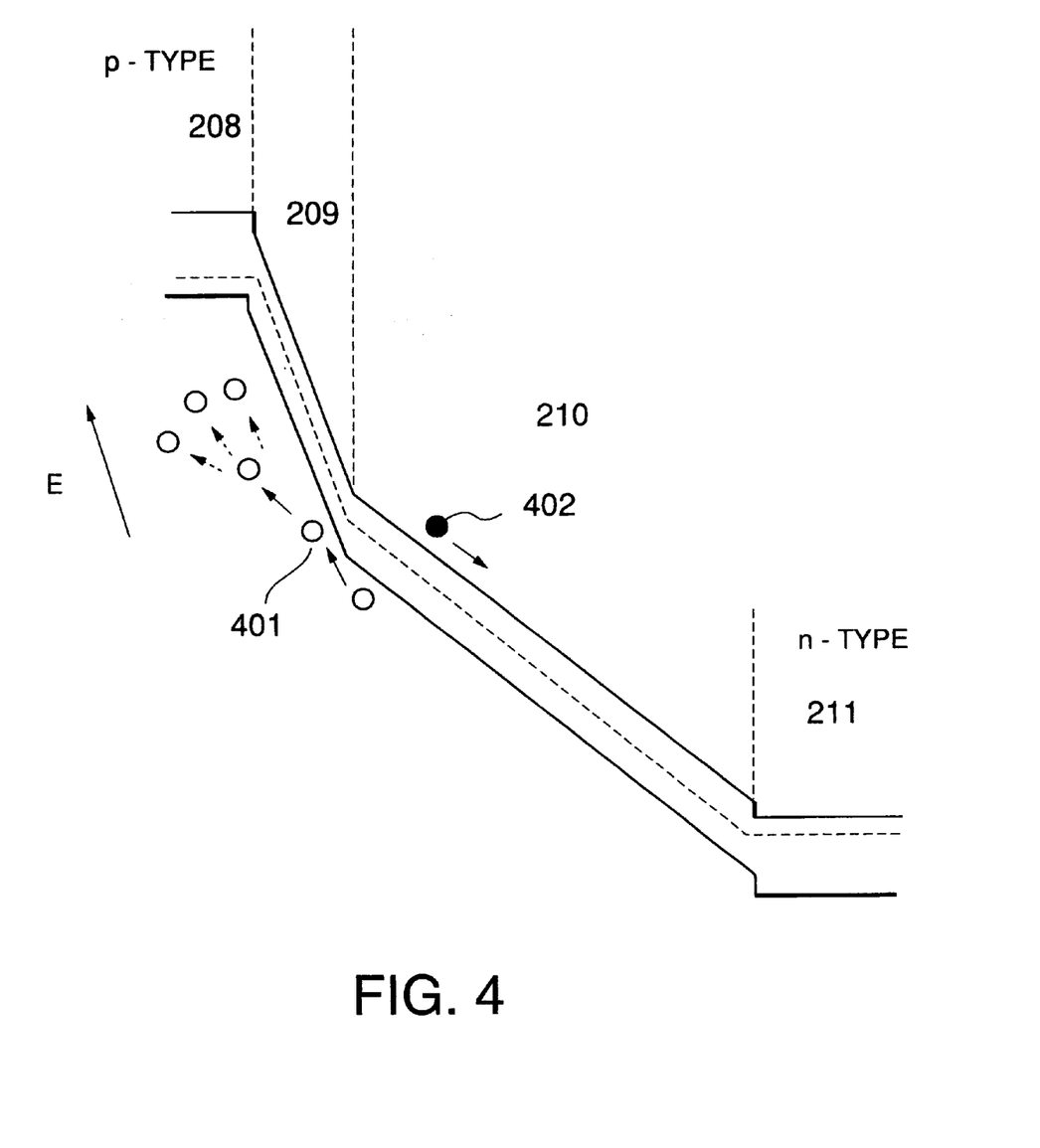
FIG. 4 is a band diagram for explaining an current multiplication effect.

FIG. 4 is a diagram for explaining the current multiplication effect in this preferred embodiment. When an average electric field of about $9 \times 10^7$ V/m or higher is applied, Se causes a current multiplication. In this preferred embodiment, as shown in FIG. 4, the electric field in the Se film 209 exceeds an electric field causing a signal multiplication, so that carrier is multiplied in the Se film 209 to increase the signal current. On the other hand, in the conventional X-ray-to-charge converting film having a uniform thickness, no current multiplication occurs unless the electric field is about ten times as large as that in this preferred embodiment, so that it is difficult to produce a usable high-voltage power supply. In addition, if the thickness is decreased, it is possible to cause current multiplication even if a high-voltage power supply conventionally. However, if the thickness is decreased, it is not possible to absorb a sufficient quantity of X-rays, so that it is not possible to use the X-ray image detector system in good efficiency.

Therefore, in this preferred embodiment, the two layers of the X-ray-to-charge converting films 209 and 210 having different characteristics are used for the current multiplication function, so that it is possible to obtain a large signal current, i.e., detect an image, even if X-ray irradiation is weak. Thus, it is possible to improve the quality of the image, and it is possible to decrease the influence of X-rays on human bodies.

Furthermore, in the above-described preferred embodiment, the Se film 208 is a p-type semiconductor, and the Se film 211 is an n-type semiconductor. These semiconductor films have the function of improving the ohmic contact of the metal electrode to the X-ray photoelectric transfer film and introducing majority carrier from the metal electrode when X-ray irradiation serving as noises is not carried out, i.e., holding a low OFF-state current. The carrier multiplication effect, which is the main point of the present invention, is produced by the intermediate high-resistivity semiconductor films 209 and 210. In order to hold a low current during no X-ray irradiation, a high-resistivity film other than the semiconductor films 208 and 211 may be provided if necessary.

Figure 5:
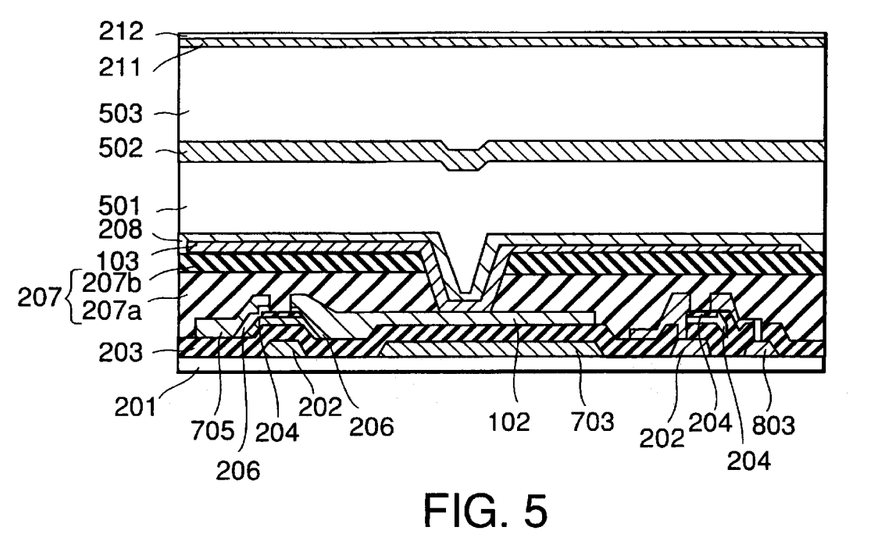
FIG. 5 is a sectional view of the second preferred embodiment of an X-ray image detector system according to the present invention.

Referring to FIG. 5, the second preferred embodiment of an X-ray image detector system according to the present invention will be described below. The construction of the pixel is the same as that in the first preferred embodiment, and shown in FIGS. 1 and 9. FIG. 5 is a sectional view in this preferred embodiment. The same reference numbers are used for the same portions as those in the first preferred embodiment, and the descriptions thereof are omitted.

In this preferred embodiment, after a p-type Se film 208 for contact is deposited similar to the first preferred embodiment, an Se film 501 having a resistivity of about $1 \times 10^{13}$ Ωm is deposited so as to have a thickness of about 100 μm. Then, after an Se film 502 having a resistivity of about $1 \times 10^{14}$ Ωm is deposited so as to have a thickness of about 100 μm, an Se film 503 having a resistivity of about $1 \times 10^{13}$ Ωm is deposited so as to have a thickness of about 900 μm. Moreover, similar to the first preferred embodiment, an n-type Se film 211 and a common electrode 212 are formed. In general, a current multiplication type sensitizing film has a high electric field, and the electric field concentrates on the non-uniform portion of the film of the contact portion 104 or the like, so that there is some possibility of causing dielectric breakdown. In this preferred embodiment, in order to avoid this breakdown, the current multiplication region is separated from the contact portion 104 to be provided between the films, so that the irregularity decreases to inhibit the concentration of the electric field.

The current multiplication is mainly carried out by a hole 401. Therefore, the greater multiplication factor of the Se film 502 increases as the distance between the Se film 502 and the pixel electrode 103 decreases, since more holes 401 are produced by the absorbed X-rays. Thus, the Se film 502 is preferably arranged nearer to the pixel electrode 103 than the center of the thickness of the Se film. However, since the multiplication factor is sufficiently large, it is possible to select an appropriate position by adjusting the voltage characteristics and the multiplication factor.

Also in this preferred embodiment, it is possible to obtain the same multiplication effect as that in the first preferred embodiment, and it is possible to more stably withstand a high voltage, so that it is possible to realize a more stable operation.

Figure 6:
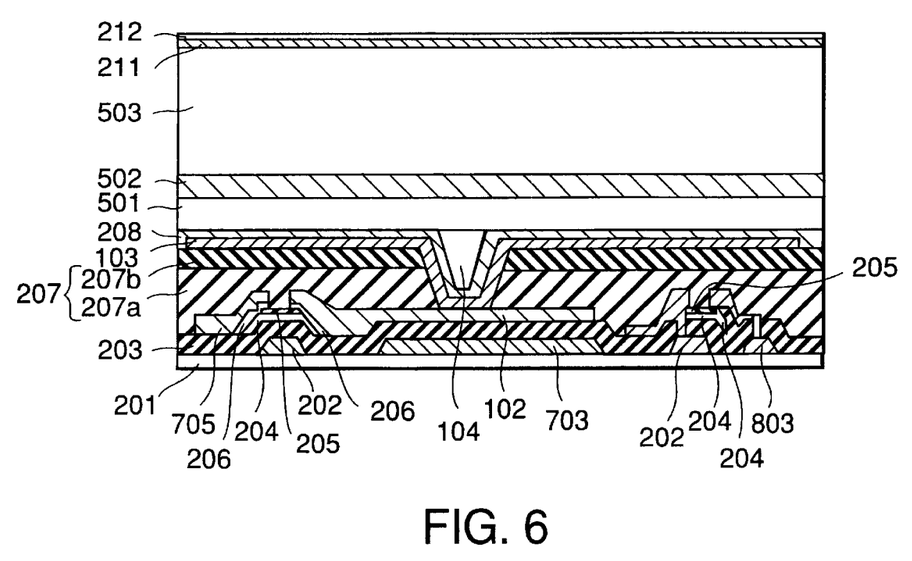
FIG. 6 is a sectional view of the third preferred embodiment of an X-ray image detector system according to the present invention.

Referring to FIG. 6, the third preferred embodiment of an X-ray detector system according to the present invention will be described below.

The construction of the pixel is the same as that in the first preferred embodiment as shown in FIGS. 1 and 9. The cross section of this preferred embodiment is shown in FIG. 6. The same reference numbers are used for the same portions as those in the second preferred embodiment, and the descriptions thereof are omitted.

This preferred embodiment is the same as the second preferred embodiment, except that the recess in the contact portion 104 of the pixel electrode 103 is electroplated with Sn, Ni, Cu or the like to be flattened and a liquid conductive material is embedded. This is carried out to flatten the contact portion 104 to prevent the concentration of the electric field, similar to the second preferred embodiment. Also in this preferred embodiment, it is possible to multiply signals and it is possible to withstand a high voltage similar to the second preferred embodiment.

Furthermore, the material of the X-ray-to-charge converting film should not be limited to Se as long as the film has the multiplication effect. For example, the material of the X-ray-to-charge converting film may be selected from the group consisting of As-Te-Se alloy, Se containing an impurity, such as a halogen, As-Te-Se alloy, $HgI_2$ and Te. The thickness of the X-ray-to-charge converting film may be selected so as to sufficiently absorb used X-rays. The X-ray-to-charge converting film may comprise two or more layers having suitably selected resistivity and thickness. While the electric field strength for avalanche multiplication has been $9 \times 10$ V/cm or higher when the material of the film is Se, the electric field may be suitably adjusted in accordance with the kind of the X-ray-to-charge converting transfer film and the added impurity. In addition, the conductive type of the X-ray-to-charge converting film should not be limited to n-i-p-type in this preferred embodiment, it may be p-i-n-type or another type. The i-type means an intrinsic semiconductor. The i layer, to which a high electric field is applied, has only to comprise two or more layers of high resistivity and low resistivity layers.

The current multiplication effect as described in detail is effective in any array structures since it does not depend on the array structure of the underlayer. While the direct conversion type has been described, the above-described current multiplication effect is also applicable in the indirect conversion type.

Figure 7:
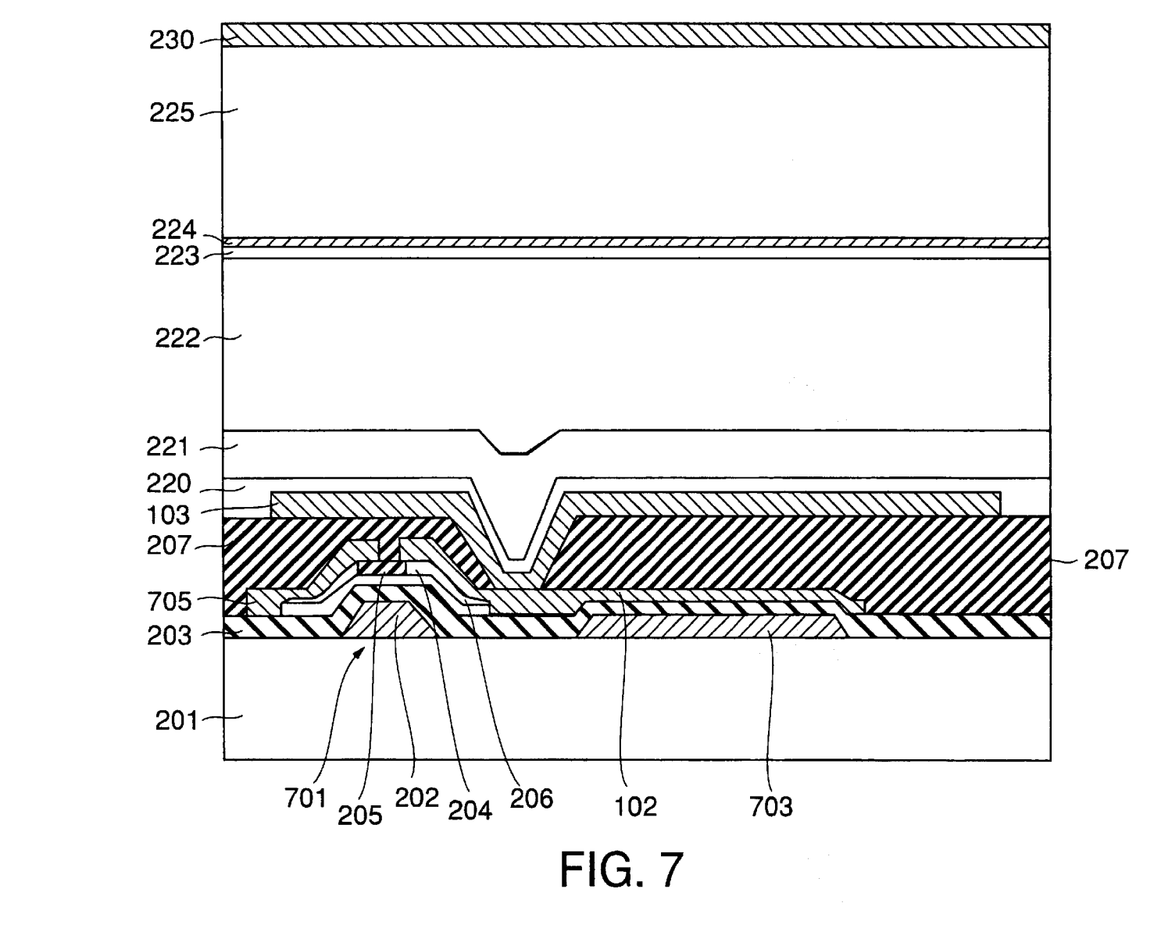
FIG. 7 is a sectional view of the fourth preferred embodiment of an X-ray image detector system according to the present invention.

In an X-ray image detector system of an indirect conversion type, when X-rays are incident thereon, a phosphor irradiated with X-rays emits fluorescence, which is converted into an electric charge by means of a photoelectric transfer part. This electric charge produces a signal current to be taken out similar to the X-ray image detector system of the direct conversion type. Thus, in order to carry out signal multiplication in the X-ray image detector system of the indirect conversion type according to the present invention, the photoelectric transfer part may comprise a first photoelectric transfer film having an adjusted thickness and resistivity, and a second photoelectric transfer film having an adjusted thickness and resistivity. In this case, a high electric field exists in the first photoelectric transfer film, so that the signal current increases. Referring to FIG. 7, such a construction will be described as an example of a photoelectric transfer film of an amorphous silicon.

FIG. 7 is a sectional view of the fourth preferred embodiment of an X-ray image detector system of an indirect conversion type according to the present invention. As shown in FIG. 7, a metal layer of a metallic material, such as MoTa, Ta, TaN, Al, Al alloy, Cu or MoW, or a laminated metal layer of two layers of metallic materials of Ta and TaNx, is deposited on a glass substrate 201 so as to have a thickness of about 300 nm, and etched to form a pattern of the gate electrode 202 of a switching element 701, a scanning line 706, a pixel capacity 703 and a pixel capacity line (not shown). Then, using the plasma CVD method, after an insulator film 203 is deposited by laminating an $SiO_x$ film having a thickness of about 300 nm and an $SiN_x$ film having a thickness of about 50 nm, an amorphous silicon film 204 containing no impurities and having a thickness of about 100 nm, and an $SiN_x$ film having a thickness of about 200 nm serving as a stopper 205 are deposited. The stopper 205 is aligned with the gate to be patterned using the reverse exposure. Then, after an $n^+$-type amorphous silicon film 206 having a thickness of about 50 nm is deposited, the amorphous silicon film 204 and the $n^+$-type amorphous silicon film 206 are aligned with the TFT to be etched to form islands of an amorphous silicon (active layer). The insulator film 203 of the contact portion outside of the pixel area are etched to form contact holes. Subsequently, an Mo film having a thickness of about 50 nm, an Al film having a thickness of about 350 nm, and an Mo film having a thickness of about 50 nm or about 20 nm are sputtered and deposited on the whole surface to be patterned to form an auxiliary electrode 102, a signal line 705 and other wiring.

Then, a film of $SiN_x$ having a thickness of about 200 nm, and a film of black resist having a thickness of about 1 $\mu$m to about 5 $\mu$m, preferably about 3 $\mu$m, are laminated to form a protective film 207. After contact holes are formed in the TFT 701 and the auxiliary electrode 102, an ITO having a thickness of about 100 nm is deposited to be patterned to form a pixel electrode 103. Since a high voltage is not applied to a photoelectric transfer film of an indirect conversion type, a protecting diode for preventing the pixel potential from being a high potential is not provided.

Then, a p-type amorphous silicon film 220 for contact is deposited on the pixel electrode 103 so as to have a thickness of about 10 nm to about 300 nm, preferably about 200 nm, and an amorphous silicon film 221 having a resistivity of about $1\times10^{10}$ to about $1\times10^{3}$ $\Omega$m is deposited thereon so as to have a thickness of about 100 nm to about 500 nm, preferably about 200 nm. Then, an amorphous silicon film 222 having a resistivity of about one-tenth as large as that of the amorphous silicon film 221 is deposited on the amorphous silicon film 221 so as to have a thickness of about 900 nm to about 4500 nm, preferably about 2 $\mu$m.

Then, after an n-type amorphous silicon film 223 is deposited on the amorphous silicon film 222 so as to have a thickness of about 10 nm to about 300 nm, preferably about 200 nm, a common electrode 224 of ITO having a thickness of about 100 nm is formed. On the common electrode 224, a phosphor 225 for X-rays of CsI or $Gd_2O_2S$ (gadolinium oxysulfide) is deposited so as to have a thickness of about 100 $\mu$m to 1000 $\mu$m. Then, a reflective layer 230 of Al for reflection of fluorescence is deposited thereon so as to have a thickness of about 100 nm. Finally, the common electrode 224 and so forth are connected to a drive circuit (not shown).

The resistivity of the amorphous silicon films is controlled as follows. In the formation of the low resistivity layer, P or B of about 1000 ppm to about 5% by atom is added to the amorphous silicon for n-type or p-type, respectively. Since an amorphous silicon containing no impurities usually has a weak n-type, the resistivity of the amorphous silicon film can be increased by adding B of about 10 to 500 ppm of an acceptor. Because the resistivity of the amorphous silicon film can be increased by adding B of the acceptor since the amorphous silicon film usually has an n-type.

The material of the photoelectric transfer film should not be limited to amorphous silicon as long as the film has the multiplication effect. For example, the material of the photoelectric transfer film may be selected from the group consisting of CdSe, CdTe, an alloy of amorphous silicon, C and Ge, GaAs, and amorphous GaN. And the impurity may be suitably added in the above material. The thickness of the photoelectric transfer film may be selected so as to sufficiently absorb luminescent light. In addition, the photoelectric transfer film may comprise two or more layers having suitably selected resistivity and thickness so as to form an electric field wherein current is multiplied. The multiplied electric field may be suitably adjusted in accordance with the kind of the photoelectric transfer film and the added impurity. Moreover, the conductive type of the photoelectric transfer film should not be limited to n-i-p-type in this preferred embodiment, it may be p-i-n-type or another type. The i layer, to which a high electric field is applied, should be composed of two or more layers of high resistivity and low resistivity layers.

While Si forming the TFT has been amorphous silicon in the above-described preferred embodiment, the TFT may be formed of a polysilicon. If the TFT is formed of a polysilicon, the size of the TFT can be decreased, so that the effective area of each pixel can be increased. In addition, since peripheral circuits can be prepared on the same glass substrate, it is possible to decrease the production costs including the costs for the peripheral circuits. Furthermore, the structure of the TFT may be either an upper gate type or a lower gate type.

The passivation film 207 may be formed of an inorganic $SiN_x$ or $SiO_2$, an organic polyimide ($\epsilon$=3.3, voltage proof 300 V/mm), benzocyclobutene ($\epsilon$=2.7, voltage proof 400 V/mm), an acrylic resin, e.g., acrylic photosensitized resin HRC ($\epsilon$=3.2) commercially available from JSR, or black resist. These may be laminated if necessary. Fluorine contained resins may be effectively used as the passivation film 207 since the fluorine contained resins have a small relative dielectric constant. Although the passivation film is not always required to be photosensitive, a photosensitive material is more effective since it can be easily patterned.

It is effective to form a p-type film on a pixel electrode since the ohmic characteristic is improved.

The X-ray-to-charge converting film may be formed of amorphous Se, an alloy of Se and Te or As, amorphous Si, amorphous Te, $PbI_2$, or $HgI_2$.

As described above, according to the signal multiplication X-ray image detector system of the present invention, the X-ray-to-charge converting film or the photoelectric transfer film has current multiplication characteristics to increase the signal intensity to be resistant to noises. Therefore, it is possible to detect weak signals, so that it is possible to detect an image even in the case of weak X-irradiation. Thus, it is possible to use the X-ray image detect system in a more safe state to human bodies.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. An X-ray image detector system comprising:
   a plurality of scanning lines;
   a plurality of signal lines formed so as to intersect the scanning lines; and
   a plurality of pixel parts, each of which is formed at a corresponding one of the intersections between said scanning lines and said signal lines so as to form an array,
   each of said pixel parts having
   an X-ray-to-charge converting part for converting an incident X-ray to a charge,
   a pixel electrode for receiving said charge from said X-ray-to-charge converting part, and
   a switching element which is operated on the basis of a signal of a corresponding one of said scanning lines, one end of said switching element being connected to said pixel electrode, and the other end of said switching element being connected to a corresponding one of said signal lines,
   wherein said X-ray-to-charge converting part includes at least a first X-ray-to-charge converting film, and a second X-ray-to-charge converting film having a lower resistivity than that of said first X-ray-to-charge converting film.

2. An X-ray image detector system as set forth in claim 1, wherein an electric field for causing a current multiplication is applied to said first X-ray-to-charge converting film.

3. An X-ray image detector system as set forth in claim 2, wherein each of said first and second X-ray-to-charge converting films is formed of Se, and said electric field for causing the current multiplication is $9 \times 10^7$ V/m.

4. An X-ray image detector system as set forth in claim 1, wherein said X-ray-to-charge converting part has a third X-ray-to-charge converting film of a first conductive type formed between said pixel electrode and said first X-ray-to-charge converting film, and a fourth X-ray-to-charge converting film of a second conductive type formed on said second X-ray-to-charge converting film, said second X-ray-to-charge converting film being formed on said first X-ray-to-charge converting film.

5. An X-ray image detector system as set forth in claim 4, wherein said X-ray-to-charge converting part has a fifth X-ray-to-charge converting film having a lower resistivity than that of said first X-ray-to-charge converting film between said third X-ray-to-charge converting film and said first X-ray-to-charge converting film.

6. An X-ray image detector system as set forth in claim 4, wherein at least one boundary surface of said first X-ray-to-charge converting film is flattened.

7. An X-ray image detector system as set forth in claim 6, wherein said first X-ray-to-charge converting film has a non-flat portion on said boundary surface, said non-flat portion being filled with a conductive material.

8. An X-ray image detector system as set forth in claim 5, wherein the thickness of said fifth X-ray-to-charge converting film is smaller than the thickness of said second X-ray-to-charge converting film.

9. An X-ray image detector system as set forth in claim 5, wherein at least one boundary surface of said first X-ray-to-charge converting film is flattened.

10. An X-ray image detector system comprising:
- a plurality of scanning lines;
- a plurality of signal lines formed so as to intersect the scanning lines; and
- a plurality of pixel parts, each of which is formed at a corresponding one of the intersections between said scanning lines and said signal lines so as to form an array, each of said pixel parts having an X-ray-to-luminescent light converting part for converting an incident X-ray to luminescent light, a photoelectric transfer part, formed on said plurality of pixel parts, for converting said luminescent light, which is converted by said X-ray-to-luminescent light converting part, to an electric charge, a pixel electrode for receiving said electric charge from said photoelectric transfer part, and a switching element which is operated on the basis of a signal of a corresponding one of said scanning lines, one end of said switching element being connected to said pixel electrode, and the other end of said switching element being connected to a corresponding one of said signal lines, wherein said photoelectric transfer part includes at least a first photoelectric transfer film, and a second photoelectric transfer film having a lower resistivity than that of said first photoelectric transfer film.

11. An X-ray image detector system as set forth in claim 1, wherein said switching element includes a thin film transistor.

* * * * *